United States Patent
Kardasz et al.

(10) Patent No.: US 10,784,439 B2
(45) Date of Patent: Sep. 22, 2020

(54) PRECESSIONAL SPIN CURRENT MAGNETIC TUNNEL JUNCTION DEVICES AND METHODS OF MANUFACTURE

(71) Applicant: SPIN MEMORY, Inc., Fremont, CA (US)

(72) Inventors: Bartlomiej Kardasz, Fremont, CA (US); Jorge Vasquez, Fremont, CA (US); Mustafa Pinarbasi, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/859,243

(22) Filed: Dec. 29, 2017

(65) Prior Publication Data

US 2019/0207097 A1 Jul. 4, 2019

(51) Int. Cl.
| | | |
|---|---|---|
| *H01L 43/08* | (2006.01) | |
| *H01L 43/12* | (2006.01) | |
| *H01L 43/02* | (2006.01) | |
| *H01L 27/22* | (2006.01) | |
| *H01L 43/10* | (2006.01) | |

(52) U.S. Cl.
CPC .............. *H01L 43/08* (2013.01); *H01L 43/02* (2013.01); *H01L 43/12* (2013.01); *H01L 27/222* (2013.01); *H01L 43/10* (2013.01)

(58) Field of Classification Search
CPC .......... H01L 43/08; H01L 43/12; H01L 43/10
See application file for complete search history.

(56) References Cited

U.S. PATENT DOCUMENTS

| | | |
|---|---|---|
| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Zlonczewski |
| 5,732,016 A | 3/1998 | Chen et al. |
| 5,751,647 A | 5/1998 | O'Toole |
| 5,856,397 A | 1/1999 | Mauri |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |

(Continued)

FOREIGN PATENT DOCUMENTS

| | | |
|---|---|---|
| CA | 2766141 | 1/2011 |
| CN | 105706259 | 6/2016 |
| EP | 1345277 | 9/2003 |
| FR | 2817998 | 6/2002 |

(Continued)

OTHER PUBLICATIONS

US 7,026,672 B2, 04/2006, Grandis (withdrawn)

(Continued)

*Primary Examiner* — Bilkis Jahan
*Assistant Examiner* — Victor V Barzykin

(57) ABSTRACT

A Magnetic Tunnel Junction (MTJ) device can include a second Precessional Spin Current (PSC) magnetic layer of Ruthenium (Re) having a predetermined thickness and a predetermined smoothness. An etching process for smoothing the PSC magnetic layer can be performed in-situ with various deposition processes after a high temperature annealing of the MTJ formation.

16 Claims, 11 Drawing Sheets

(56) References Cited

U.S. PATENT DOCUMENTS

| | | |
|---|---|---|
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,938,142 B2 | 8/2005 | Pawlowski |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,377 B2 | 3/2006 | Huai et al. |
| 7,009,877 B1 | 3/2006 | Huai et al. |
| 7,041,598 B2 | 5/2006 | Sharma |
| 7,045,368 B2 | 5/2006 | Hong et al. |
| 7,057,922 B2 | 6/2006 | Fukumoto |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,372,722 B2 | 5/2008 | Jeong |
| 7,376,006 B2 | 5/2008 | Bednorz et al. |
| 7,386,765 B2 | 6/2008 | Ellis |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,642,612 B2 | 1/2010 | Izumi et al. |
| 7,660,161 B2 | 2/2010 | Van Tran |
| 7,733,699 B2 | 6/2010 | Roohparvar |
| 7,773,439 B2 | 8/2010 | Do et al. |
| 7,776,665 B2 | 8/2010 | Izumi et al. |
| 7,852,662 B2 | 12/2010 | Yang |
| 7,881,095 B2 | 2/2011 | Lu |
| 7,911,832 B2 | 3/2011 | Kent et al. |
| 7,936,595 B2 | 5/2011 | Han et al. |
| 7,986,544 B2 | 7/2011 | Kent et al. |
| 8,080,365 B2 | 12/2011 | Nozaki |
| 8,088,556 B2 | 1/2012 | Nozaki |
| 8,094,480 B2 | 1/2012 | Tonomura |
| 8,144,509 B2 | 3/2012 | Jung |
| 8,148,970 B2 | 4/2012 | Fuse |
| 8,255,742 B2 | 8/2012 | Ipek |
| 8,278,996 B2 | 10/2012 | Miki |
| 8,279,666 B2 | 10/2012 | Dieny et al. |
| 8,334,213 B2 | 12/2012 | Mao |
| 8,349,536 B2 | 1/2013 | Nozaki |
| 8,363,465 B2 | 1/2013 | Kent et al. |
| 8,386,836 B2 | 2/2013 | Burger |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong |
| 8,492,881 B2 | 7/2013 | Kuroiwa et al. |
| 8,535,952 B2 | 9/2013 | Ranjan et al. |
| 8,539,303 B2 | 9/2013 | Lu |
| 8,549,303 B2 | 10/2013 | Fifield et al. |
| 8,574,928 B2 | 11/2013 | Satoh et al. |
| 8,582,353 B2 | 11/2013 | Lee |
| 8,593,868 B2 | 11/2013 | Park |
| 8,617,408 B2 | 12/2013 | Balamane |
| 8,625,339 B2 | 1/2014 | Ong |
| 8,634,232 B2 | 1/2014 | Oh |
| 8,716,817 B2 | 5/2014 | Saida |
| 8,737,137 B1 | 5/2014 | Choy et al. |
| 8,780,617 B2 | 7/2014 | Kang |
| 8,792,269 B1 | 7/2014 | Abedifard |
| 8,852,760 B2 | 10/2014 | Wang et al. |
| 8,902,628 B2 | 12/2014 | Ha |
| 8,966,345 B2 | 2/2015 | Wilkerson |
| 9,019,754 B1 | 4/2015 | Bedeschi |
| 9,026,888 B2 | 5/2015 | Kwok |
| 9,043,674 B2 | 5/2015 | Wu |
| 9,082,888 B2 | 7/2015 | Kent et al. |
| 9,104,595 B2 | 8/2015 | Sah |
| 9,140,747 B2 | 9/2015 | Kim |
| 9,165,629 B2 | 10/2015 | Chih |
| 9,166,155 B2 | 10/2015 | Deshpande |
| 9,229,853 B2 | 1/2016 | Khan |
| 9,245,608 B2 | 1/2016 | Chen et al. |
| 9,250,990 B2 | 2/2016 | Motwani |
| 9,263,667 B1 | 2/2016 | Pinarbasi |
| 9,298,552 B2 | 3/2016 | Leem |
| 9,299,412 B2 | 3/2016 | Naeimi |

(56) References Cited

U.S. PATENT DOCUMENTS

| | | |
|---|---|---|
| 9,317,429 B2 | 4/2016 | Ramanujan |
| 9,337,412 B2 | 5/2016 | Pinarbasi et al. |
| 9,362,486 B2 | 6/2016 | Kim et al. |
| 9,378,317 B2 | 6/2016 | Kawai |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,449,720 B1 | 9/2016 | Lung |
| 9,450,180 B1 | 9/2016 | Annunziata |
| 9,455,013 B2 | 9/2016 | Kim |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,508,456 B1 | 11/2016 | Shim |
| 9,548,445 B2 | 1/2017 | Lee et al. |
| 9,553,102 B2 | 1/2017 | Wang |
| 9,583,167 B2 | 2/2017 | Chung |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,853,006 B2 | 12/2017 | Avin et al. |
| 9,853,206 B2 | 12/2017 | Pinarbasi et al. |
| 9,853,292 B2 | 12/2017 | Loveridge et al. |
| 9,865,806 B2 | 1/2018 | Choi et al. |
| 10,026,609 B2 | 7/2018 | Sreenivasan et al. |
| 10,043,851 B1 | 8/2018 | Shen |
| 10,115,446 B1 | 10/2018 | Louie et al. |
| 10,163,479 B2 | 12/2018 | Yoha |
| 2002/0057593 A1 | 5/2002 | Hidaka |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0047179 A1 | 3/2004 | Chan |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0197174 A1 | 10/2004 | Van Den Berg |
| 2004/0221030 A1 | 11/2004 | Huras |
| 2004/0257717 A1 | 12/2004 | Sharma et al. |
| 2005/0022746 A1 | 2/2005 | Lampe |
| 2005/0029551 A1 | 2/2005 | Atwood et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0160205 A1 | 7/2005 | Kuo |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0251628 A1 | 11/2005 | Jarvis et al. |
| 2005/0280058 A1 | 12/2005 | Pakala et al. |
| 2005/0285176 A1 | 12/2005 | Kim |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0198202 A1 | 9/2006 | Erez |
| 2006/0227465 A1 | 10/2006 | Inokuchi et al. |
| 2006/0271755 A1 | 11/2006 | Miura |
| 2006/0284183 A1 | 12/2006 | Izumi et al. |
| 2006/0291305 A1 | 12/2006 | Suzuki et al. |
| 2007/0019337 A1 | 1/2007 | Apalkov et al. |
| 2007/0094573 A1 | 4/2007 | Chen |
| 2007/0096229 A1 | 5/2007 | Yoshikawa |
| 2007/0220935 A1 | 9/2007 | Cernea |
| 2007/0226592 A1 | 9/2007 | Radke |
| 2007/0242501 A1 | 10/2007 | Hung et al. |
| 2007/0283313 A1 | 12/2007 | Ogawa |
| 2007/0285972 A1 | 12/2007 | Horii |
| 2008/0049487 A1 | 2/2008 | Yoshimura |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0144376 A1 | 6/2008 | Lee |
| 2008/0151614 A1 | 6/2008 | Guo |
| 2008/0181009 A1 | 7/2008 | Arai |
| 2008/0259508 A2 | 10/2008 | Kent et al. |
| 2008/0294938 A1 | 11/2008 | Kondo |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0078927 A1 | 3/2009 | Xiao |
| 2009/0080267 A1 | 3/2009 | Bedeschi |
| 2009/0091037 A1 | 4/2009 | Assefa et al. |
| 2009/0098413 A1 | 4/2009 | Kanegae |
| 2009/0130779 A1 | 5/2009 | Li |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0039136 A1 | 2/2010 | Chua-Eoan |
| 2010/0080040 A1 | 4/2010 | Choi |
| 2010/0087048 A1 | 4/2010 | Izumi et al. |
| 2010/0110803 A1 | 5/2010 | Arai |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1 | 8/2010 | Norman |
| 2010/0195401 A1 | 8/2010 | Jeong et al. |
| 2010/0227275 A1 | 9/2010 | Nozaki |
| 2010/0232206 A1 | 9/2010 | Li |
| 2010/0246254 A1 | 9/2010 | Prejbeanu et al. |
| 2010/0248154 A1 | 9/2010 | Nozaki |
| 2010/0254181 A1 | 10/2010 | Chung |
| 2010/0271090 A1 | 10/2010 | Rasmussen |
| 2010/0271870 A1 | 10/2010 | Zheng et al. |
| 2010/0277976 A1 | 11/2010 | Oh |
| 2010/0290275 A1 | 11/2010 | Park |
| 2010/0311243 A1 | 12/2010 | Mao |
| 2011/0001108 A1 | 1/2011 | Greene |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0076620 A1 | 3/2011 | Nozaki |
| 2011/0089511 A1 | 4/2011 | Keshtbod et al. |
| 2011/0133298 A1 | 6/2011 | Chen et al. |
| 2011/0283135 A1 | 11/2011 | Burger |
| 2011/0310691 A1 | 12/2011 | Zhou et al. |
| 2011/0320696 A1 | 12/2011 | Fee et al. |
| 2012/0028373 A1 | 2/2012 | Belen |
| 2012/0052258 A1 | 3/2012 | Op DeBeeck et al. |
| 2012/0069649 A1 | 3/2012 | Ranjan et al. |
| 2012/0127804 A1 | 5/2012 | Ong et al. |
| 2012/0155158 A1 | 6/2012 | Higo |
| 2012/0163113 A1 | 6/2012 | Hatano et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0221905 A1 | 8/2012 | Burger |
| 2012/0228728 A1 | 9/2012 | Ueki et al. |
| 2012/0239969 A1 | 9/2012 | Dickens |
| 2012/0254636 A1 | 10/2012 | Tsukamoto et al. |
| 2012/0280339 A1 | 11/2012 | Zhang et al. |
| 2012/0294078 A1 | 11/2012 | Kent et al. |
| 2012/0299133 A1 | 11/2012 | Son et al. |

(56) References Cited

U.S. PATENT DOCUMENTS

| | | |
|---|---|---|
| 2012/0324274 A1 | 12/2012 | Hori |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao |
| 2013/0044537 A1 | 2/2013 | Ishigaki |
| 2013/0075845 A1 | 3/2013 | Chen et al. |
| 2013/0107633 A1 | 5/2013 | Kim |
| 2013/0244344 A1 | 9/2013 | Malmhall |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0275691 A1 | 10/2013 | Chew |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara |
| 2014/0042571 A1 | 2/2014 | Gan et al. |
| 2014/0048896 A1 | 2/2014 | Huang et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103469 A1 | 4/2014 | Jan |
| 2014/0103472 A1 | 4/2014 | Kent et al. |
| 2014/0136870 A1 | 5/2014 | Breternitz et al. |
| 2014/0149827 A1 | 5/2014 | Kim et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0219034 A1 | 8/2014 | Gomez et al. |
| 2014/0252439 A1 | 9/2014 | Guo |
| 2014/0264671 A1 | 9/2014 | Chepulskyy et al. |
| 2014/0269005 A1 | 9/2014 | Kang |
| 2014/0281284 A1 | 9/2014 | Block et al. |
| 2014/0289358 A1 | 9/2014 | Lindamood |
| 2014/0321196 A1 | 10/2014 | Ikeda |
| 2015/0056368 A1 | 2/2015 | Wang et al. |
| 2015/0098287 A1 | 4/2015 | Lee |
| 2015/0100848 A1 | 4/2015 | Kalamatianos |
| 2015/0135039 A1 | 5/2015 | Mekhanik et al. |
| 2015/0143343 A1 | 5/2015 | Weiss |
| 2015/0154116 A1 | 6/2015 | Dittrich |
| 2015/0171316 A1 | 6/2015 | Park et al. |
| 2015/0206568 A1 | 7/2015 | Bose et al. |
| 2015/0206569 A1 | 7/2015 | Bose et al. |
| 2015/0242269 A1 | 8/2015 | Pelley et al. |
| 2015/0262701 A1 | 9/2015 | Takizawa |
| 2015/0278011 A1 | 10/2015 | Keppel et al. |
| 2015/0279904 A1 | 10/2015 | Pinarbasi et al. |
| 2015/0378814 A1 | 12/2015 | Webb et al. |
| 2015/0380088 A1 | 12/2015 | Naeimi et al. |
| 2016/0027525 A1 | 1/2016 | Kim et al. |
| 2016/0027999 A1 | 1/2016 | Pinarhasi |
| 2016/0043304 A1 | 2/2016 | Chen |
| 2016/0056072 A1 | 2/2016 | Arvin et al. |
| 2016/0085443 A1 | 3/2016 | Tomishima et al. |
| 2016/0085621 A1 | 3/2016 | Motwani |
| 2016/0086600 A1 | 3/2016 | Bauer et al. |
| 2016/0087193 A1 | 3/2016 | Yoha |
| 2016/0093798 A1 | 3/2016 | Kim et al. |
| 2016/0111634 A1 | 4/2016 | Lee et al. |
| 2016/0118249 A1 | 4/2016 | Sreenivasan et al. |
| 2016/0124299 A1 | 5/2016 | Yu et al. |
| 2016/0126201 A1 | 5/2016 | Arvin et al. |
| 2016/0126452 A1 | 5/2016 | Kuo et al. |
| 2016/0126453 A1 | 5/2016 | Chen et al. |
| 2016/0148685 A1 | 5/2016 | Roy |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0260486 A1 | 9/2016 | Tani |
| 2016/0268499 A1 | 9/2016 | You |
| 2016/0283385 A1 | 9/2016 | Boyd et al. |
| 2016/0284762 A1 | 9/2016 | Wang et al. |
| 2016/0300615 A1 | 10/2016 | Lee |
| 2016/0307860 A1 | 10/2016 | Arvin et al. |
| 2016/0315118 A1 | 10/2016 | Kardasz et al. |
| 2016/0315249 A1 | 10/2016 | Kardasz et al. |
| 2016/0315259 A1 | 10/2016 | Fennimore et al. |
| 2016/0085692 A1 | 12/2016 | Kwok |
| 2016/0358778 A1 | 12/2016 | Park et al. |
| 2016/0372656 A1* | 12/2016 | Pinarbasi ............... H01L 43/08 |
| 2016/0378592 A1 | 12/2016 | Ikegami et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0062705 A1* | 3/2017 | Yamakawa ............ H01L 43/08 |
| 2017/0062712 A1 | 3/2017 | Choi et al. |
| 2017/0069837 A1 | 3/2017 | Choi et al. |
| 2017/0084826 A1 | 3/2017 | Zhou et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0222132 A1 | 8/2017 | Pinarbasi et al. |
| 2017/0270988 A1 | 9/2017 | Ikegami |
| 2018/0018134 A1 | 1/2018 | Kang |
| 2018/0019343 A1 | 1/2018 | Asami |
| 2018/0033957 A1 | 2/2018 | Zhang |
| 2018/0097175 A1 | 4/2018 | Chuang |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Bhatti Sabpreet et al., "Spintronics Based Random Access Memory: a Review," Material Today, Nov. 2107, pp. 530-548, vol. 20, No. 9, Elsevier.

(56) References Cited

OTHER PUBLICATIONS

Helia Naeimi, et al., "STTRAM Scaling and Retention Failure," Intel Technology Journal, vol. 17, issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using Perpendicular-to-Plane Polarizer", Applied Physics Letters, American Insitute of Physics, vol. 86, (2005), pp. 022505-1-022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

\* cited by examiner

US 10,784,439 B2

PRECESSIONAL SPIN CURRENT MAGNETIC TUNNEL JUNCTION DEVICES AND METHODS OF MANUFACTURE

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). Referring to FIGS. 1A and 1B, a simplified diagram of a MTJ, in accordance with the convention art, is shown. The MTJ can include two magnetic layers 110, 120, and a magnetic tunnel barrier layer 130. One of the magnetic layers 110 can have a fixed magnetization polarization 140, while the polarization of the magnetization of the other magnetic layer 120 can switch between opposite directions 150, 160. Typically, if the magnetic layers have the same magnetization polarization 140, 150, the MTJ cell will exhibit a relatively low resistance value corresponding to a '1' bit state; while if the magnetization polarization between the two magnetic layers is antiparallel 140, 160 the MTJ cell will exhibit a relatively high resistance value corresponding to a '0' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM devices and methods of manufacture thereof.

SUMMARY OF THE INVENTION

The present technology may best be understood by referring to the following description and accompanying drawings that are used to illustrate embodiments of the present technology directed toward Precessional Spin Current (PSC) Magnetic Tunnel Junction (MTJ) devices, improvement to Magnetic Anisotropies in MTJ devices and method of manufacture thereof.

In one embodiment, a PSC MTJ device can include one or more seed layers disposed on a substrate, a Synthetic Antiferromagnetic (SAF) formation disposed on the one or more seed layers, a MTJ formation disposed on the SAF formation, a PSC coupling layer or Perpendicular Magnetic Anisotropy (PMA) enhancement layer disposed on the MTJ formation, a first PSC magnetic layer disposed on the PSC coupling or PMA enhancement layer, and a second PSC magnetic layer disposed on the first PSC magnetic layer. The second PSC magnetic layer can have a thickness of approximately 1.5 nm and a smoothness of approximately 0.2 nm. The PSC MTJ device can further include a third PSC magnetic layer disposed on the second PSC magnetic layer, and a capping layer disposed on the third PSC magnetic layer.

In one embodiment, a method of fabricating the PSC MTJ device can include depositing the second PSC magnetic layer on the first PSC magnetic layer, wherein the second PSC magnetic layer includes Ruthenium (Ru) and the first PSC magnetic layer includes Iron (Fe). The optional intermediate capping layer can be deposited on the second PSC magnetic layer, wherein the intermediate capping layer includes Tantalum (Ta). The first and second PSC magnetic layers, and the optional intermediate capping layer, can be deposited in a first vacuum condition. Optionally, the MTJ formation can be subject to a high temperature annealing process after deposition of the first and second PSC magnetic layers and the optional intermediate capping layer if applicable. The second PSC magnetic layer, and the optional intermediate capping layer if applicable, can be etched by a two-step etching process. At least a portion of the second PSC magnetic layer can be subjected to a slow etch portion of the two-step etching process to smooth the surface of the second PSC magnetic layer. The third PSC magnetic layer can be deposited on the second PSC magnetic layer after the slow etch of the second PSC magnetic layer, wherein the third PSC magnetic layer includes ferromagnetic materials, for instance one or more of Cobalt (Co), Iron (Fe) and Boron (B). The optional capping layer can be deposited on the third magnetic layer. The two-step etching process and the deposition of the third PSC magnetic layer, and optional capping layer if applicable, can be performed in a second vacuum condition.

In another embodiment, a method of fabricating the PSC MTJ device can include receiving a wafer including a first Precessional Spin Current (PSC) magnetic layer disposed on a MTJ formation and a second PSC magnetic layer disposed on the first PSC magnetic. The first PSC magnetic layer can include Iron (Fe) and the second PSC magnetic layer can include Ruthenium (Ru). In a two-step etching process, at least a first portion of the second PSC magnetic layer can be etched with a fast etch process to remove the first portion of the second PSC magnetic layer. At least a second portion of the second PSC magnetic layer can be etched with a slow etch process to smooth the surface of the Ruthenium (Ru) of the second PSC magnetic layer as deposited. A third PSC magnetic layer can be deposited on the second PSC magnetic layer after the slow etch of the second PSC magnetic layer. The third PSC magnetic layer can include one or more of Cobalt (Co), Iron (Fe) and Boron (B). A capping layer can be deposited on the third magnetic layer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1A:
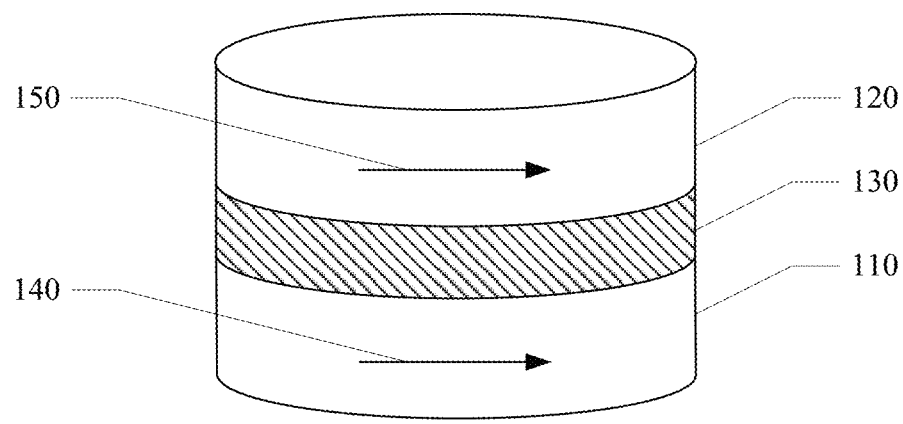
FIGS. 1A and 1B show a simplified diagram of a Magnetic Tunnel Junction (MTJ), in accordance with the convention art.
Figure 1B:
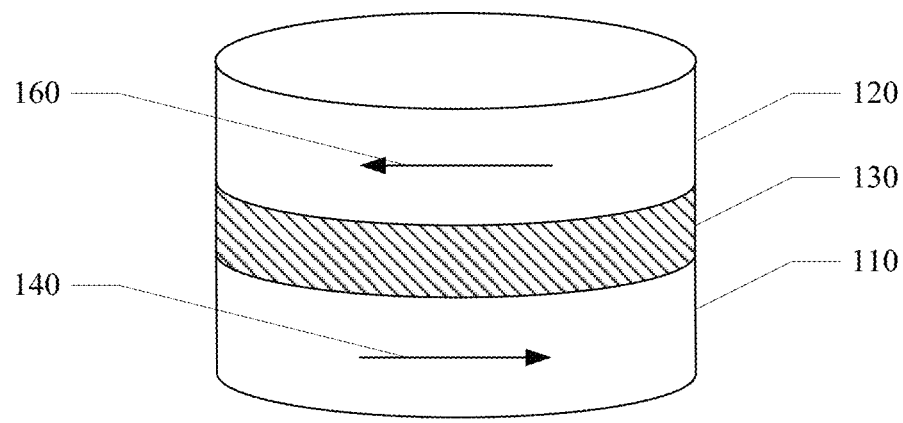

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
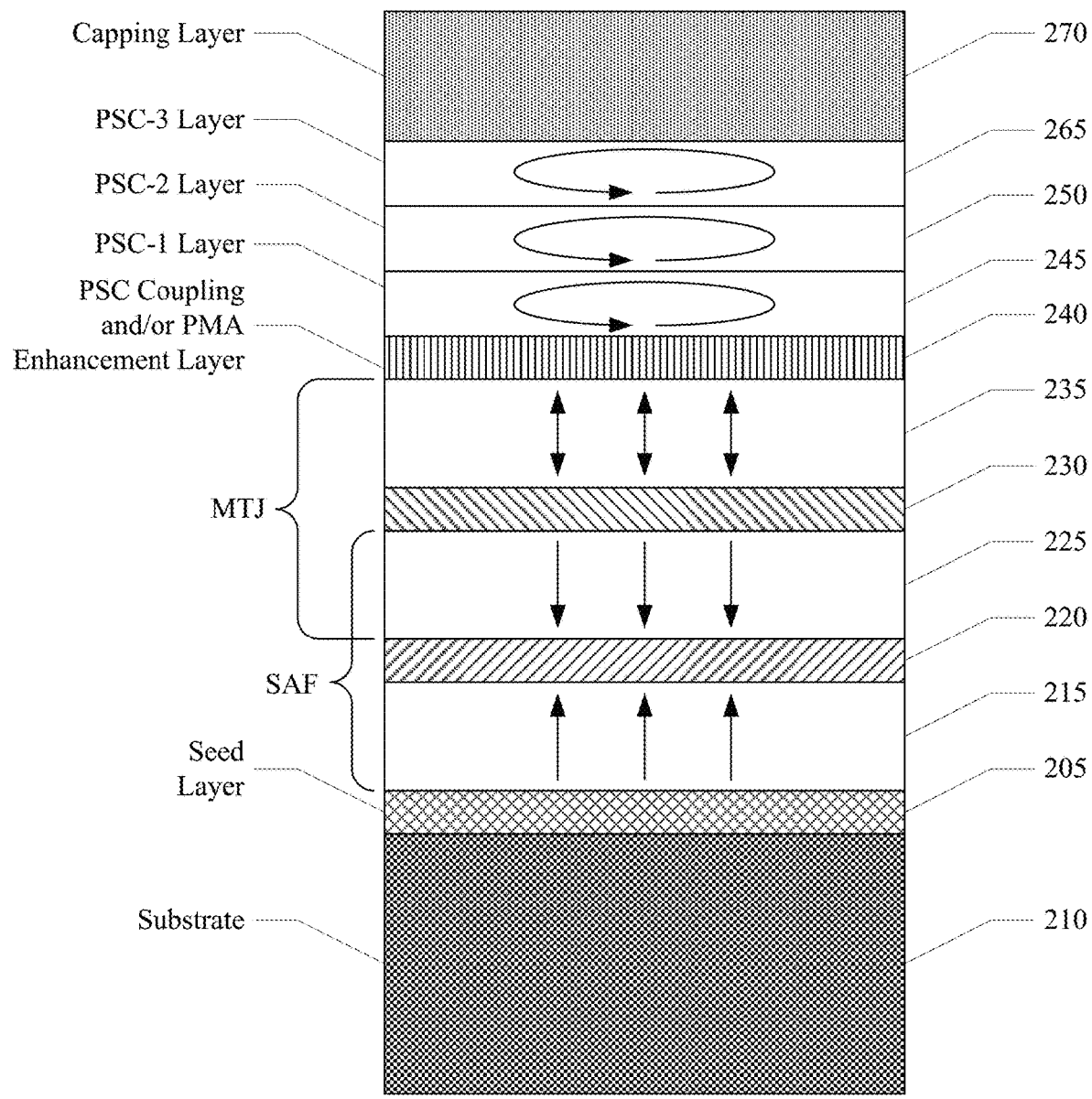
FIG. 2 shows a block diagram of a Precessional Spin Current (PSC) MTJ device, in accordance with embodiments of the present technology.

Referring to FIG. 2, a block diagram of a Precessional Spin Current (PSC) Magnetic Tunnel Junction (MTJ) device, in accordance with embodiments of the present technology, is shown. The PSC MTJ 200 can include one or more seed layers 205 disposed on a substrate 210. The one or more seed layers 205 can be deposited on the substrate 210 to initiate a predetermined crystalline growth in one or more subsequent deposited layers. In one implementation, the one or more seed layers 205 can include one or more layers of Tantalum (Ta), Tantalum Nitride (TaN), Chromium (Cr), Copper (Cu), Copper Nitride (CuN), Nickel (Ni), Iron (Fe), Platinum (Pt), Cobalt (Co) or alloys thereof with a thickness of approximately 1-20 nanometers (nm).

In one aspect, a Synthetic Antiferromagnetic (SAF) formation 215-225 can be disposed on the one or more seed layers 205. In one implementation, the SAF formation 215-225 can including a first ferromagnetic layer 215 disposed on the one or more seed layers 205, a first non-magnetic layer 220 disposed on the first ferromagnetic layer 215, and a second ferromagnetic layer 225 disposed on the first non-magnetic layer 220. The first ferromagnetic layer 215 can be a Cobalt (Co), Cobalt Nickel (CoNi), or Cobalt Platinum (CoPt) alloy with a thickness of approximately 1-5 nm, the first non-magnetic layer 220 can be a Ruthenium (Ru) metal with a thickness of approximately 0.9 nm the second ferromagnetic layer 225 can be a Cobalt (Co), Cobalt Nickel (CoNi), Cobalt Platinum (CoPt) and/or Cobalt-Iron-Boron (Co—Fe—B) alloy with a thickness of approximately 2.3 nm.

In one aspect, a MTJ formation 225-235 can be disposed on the SAF formation 215-225. In one aspect, the MTJ formation 225-235 can share one or more layers in common with the SAF formation 215-225. In one implementation, the MTJ formation 225-235 can include a reference magnetic layer 225, a non-magnetic tunneling barrier layer 230, and a free magnetic layer 235. The reference magnetic layer 225 and the second ferromagnetic layer 225 can be the same layer of Cobalt-Iron-Boron (Co—Fe—B) alloy with a thickness of approximately 1-5 nm. For ease of explanation, where the second ferromagnetic layer 225 and the reference magnetic layer 225 are the same layer, the combined layer will be referred to as the reference magnetic layer 225. The non-magnetic tunneling barrier layer 230 can be a Magnesium (Mg) oxide of approximately 1-10 nm, and the free magnetic layer 235 can be a Cobalt-Iron-Boron (Co—Fe—B) alloy with a thickness of approximately 2.3 nm. The reference magnetic layer 225 can have its magnetization pinned in a predetermined direction, meaning that the reference magnetic layer 225 has a higher coercivity than other layers and a larger magnetic field or spin-polarized current is needed to change the orientation of its magnetization. The magnetization direction of the free magnetic layer 235 can be changed by a smaller magnetic field or sin-polarized current relative to the reference magnetic layer 225.

In one aspect, the magnetization vector of the first ferromagnetic layer 215 and the reference magnetic layer 225 can be substantially perpendicular (e.g., within several degrees) to a plane of the layers (e.g., along a z-axis). The magnetization vector of the free magnetic layer 235 can also be substantially perpendicular to the plane of the layer (e.g., along a z-axis), but its direction can vary by 180 degrees.

In one aspect, a PSC coupling and/or Perpendicular Magnetic Anisotropy (PMA) enhancement layer 240 can be disposed on the MTJ formation 225-235. One or more PSC magnetic layers 245, 250, 265 can be disposed on the PSC coupling and/or PMA enhancement layer 240. In one implementation, the PSC coupling and/or PMA enhancement layer 240 can be a non-magnetic material such as Ruthenium (Ru), Tantalum (Ta), Tantalum Nitride (TaN), Copper (Cu), Copper Nitride (CuN), or Magnesium Oxide (MgO) with a thickness of approximately 1-10 nm. In one embodiment, the one or more PSC magnetic layers 245, 250 can include a first PSC magnetic layer 245 disposed on the PSC coupling and/or PMA enhancement layer 240, a second PSC magnetic layer 250 disposed on the first PSC magnetic layer 245, and a third PSC magnetic layer 265 disposed on the second PSC magnetic layer 250. In one implementation the first PSC magnetic layer 245 can be iron (Fe) with a thickness of approximately 0.6 nm, the second PSC magnetic layer 250 can be ruthenium (Ru) with a thickness of approximately 1.5 nm, and the third PSC magnetic layer 265 can be a cobalt-iron-boron (Co—Fe—B) alloy with a thickness of approximately 1.85 nm.

In one aspect, the one or more PSC magnetic layers 245, 250, 265 have a low coercivity and therefore are typically manufacture using a very soft magnetic material (e.g., less than fifty (50) Oersteds). In one implementation, the one or more PSC magnetic layers 245, 250, 265 have a magnetization vector having a direction substantially parallel to the plane of the layer (e.g., within a plane of the x-y axes), and orthogonal to the magnetization direction of the free magnetic layer 235. In another implementation, the magnetization direction of the one or more PSC magnetic layers 245, 250, 265 can have a horizontal component X and a perpendicular component Z, such that an angle θ between the plane of the free magnetic layer 235 and the magnetic direction of the one or more PSC magnetic layers 245, 250, 265 can be between 0-90 degrees.

In one aspect, a PSC coupling layer 240 can be configured to promote electromagnetic coupling between the one or more PSC magnetic layers 245, 250, 265 and the free magnetic layer 235, such that the magnetic direction of the one or more PSC magnetic layers 245, 250, 265 follow the precession cycle of the free magnetic layer 235. The PSC coupling layer 240 can also be configured to transmit spin current efficiently from the one or more PSC magnetic layers 245, 250, 265 into the free magnetic layer 235. The PSC coupling layer 240 can also be configured to promote good microstructure and high tunneling magnetoresistance (TMR). In one aspect, the one or more PSC magnetic layers 245, 250, 265 are free to rotate near the same frequency as the precessional motion of the free magnetic layer 235. By having nearly the same frequency of magnetization rotations, the free magnetic layer 235 switching time can be significantly reduced and the thermal distribution of the switching times can be tightened. The one or more PSC magnetic layers 245, 250, 265 can also have a rotational frequency greater than zero. The one or more PSC magnetic layers 245, 250, 265 can also have a circular or near circular shape so that its magnetization direction has substantially no shape induced anisotropy in the plane (e.g., the x-y plane). In one aspect, a PMA enhancement layer 240 can be configured to control magnetic anisotropy and free layer magnetization.

Figure 3A:
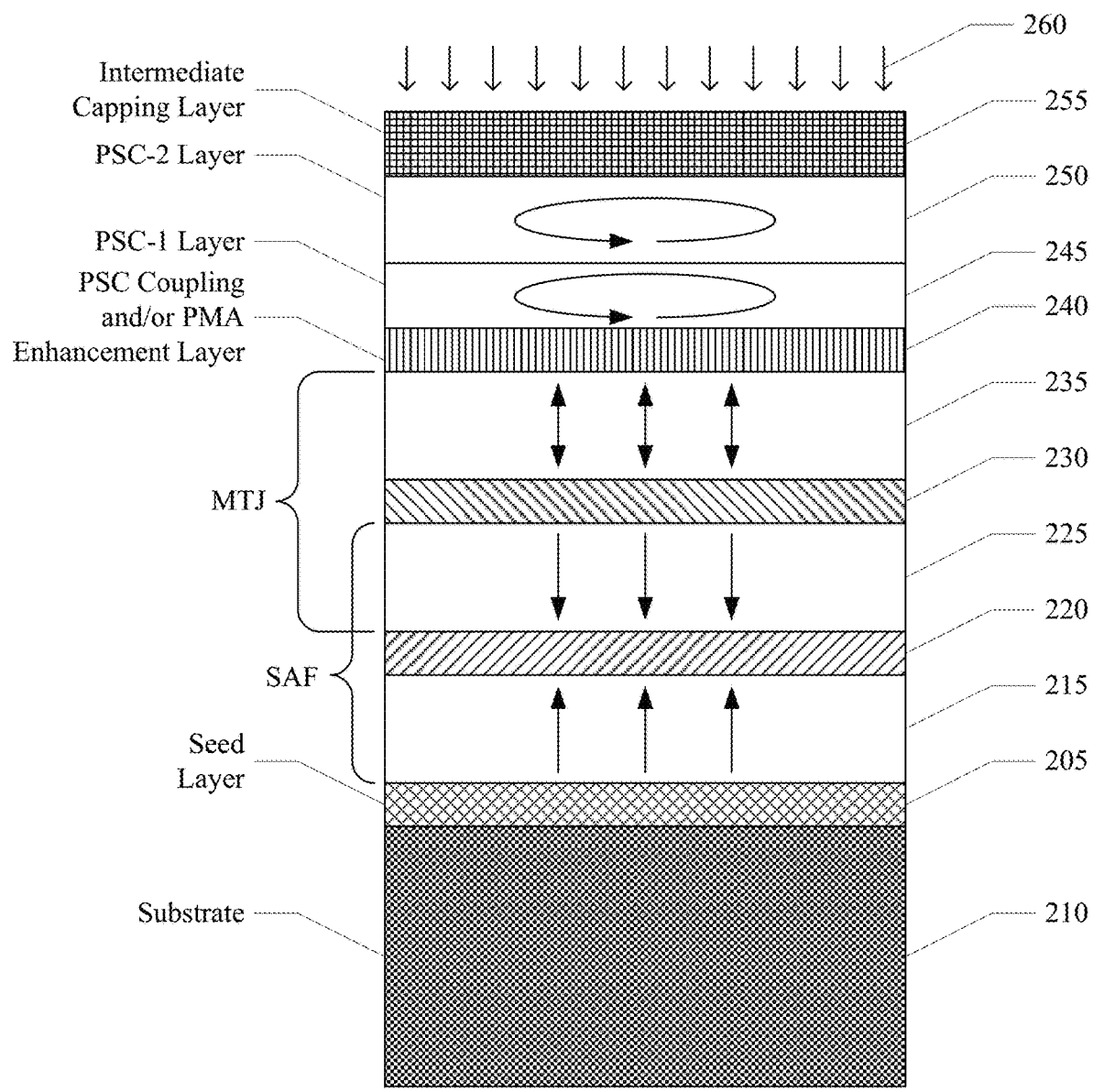
FIGS. 3A-3C show a block diagram illustrating fabrication of one or more PSC layers of a MTJ device, in accordance with embodiments of the present technology.
Figure 3B:
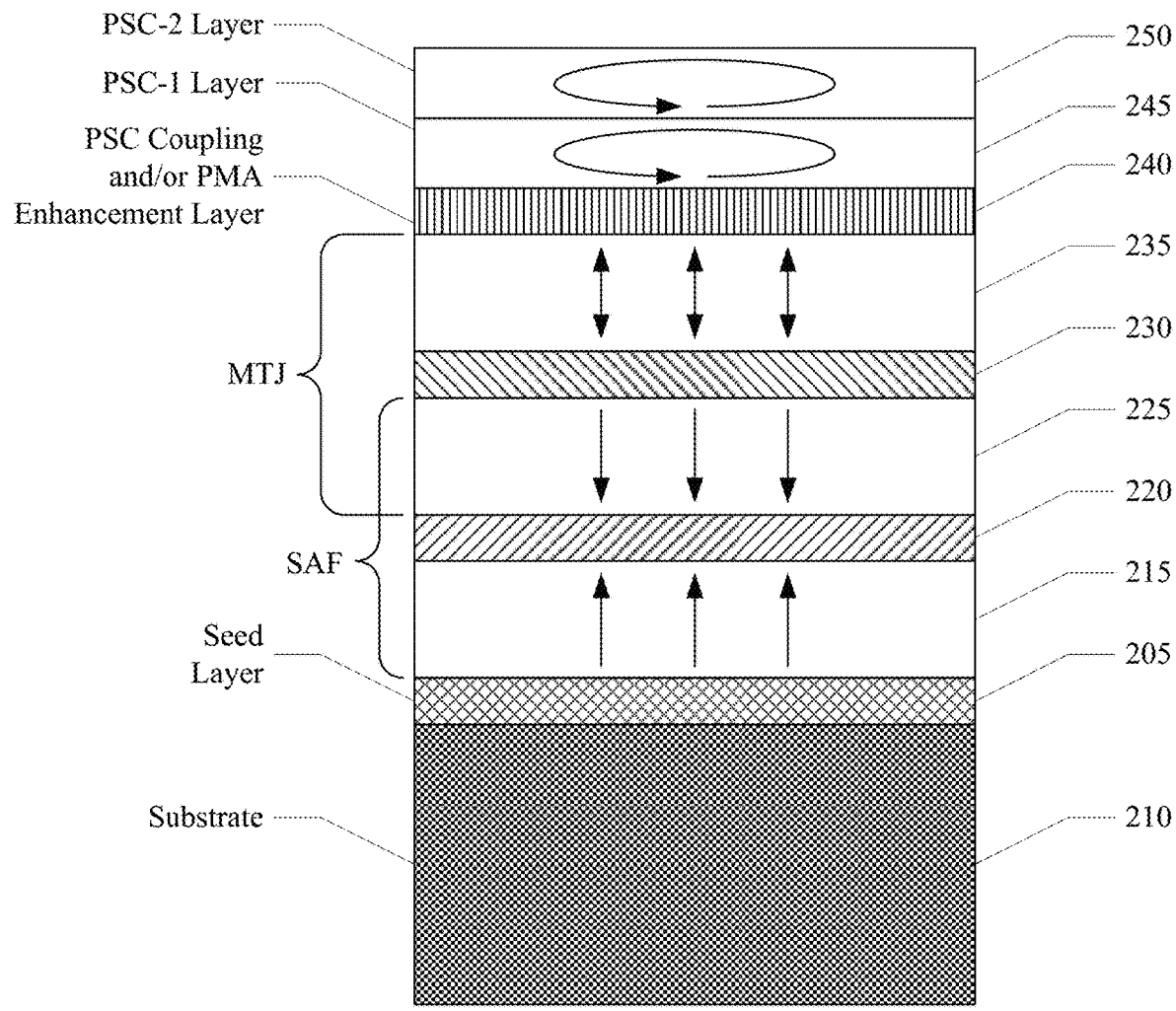
Figure 3C:
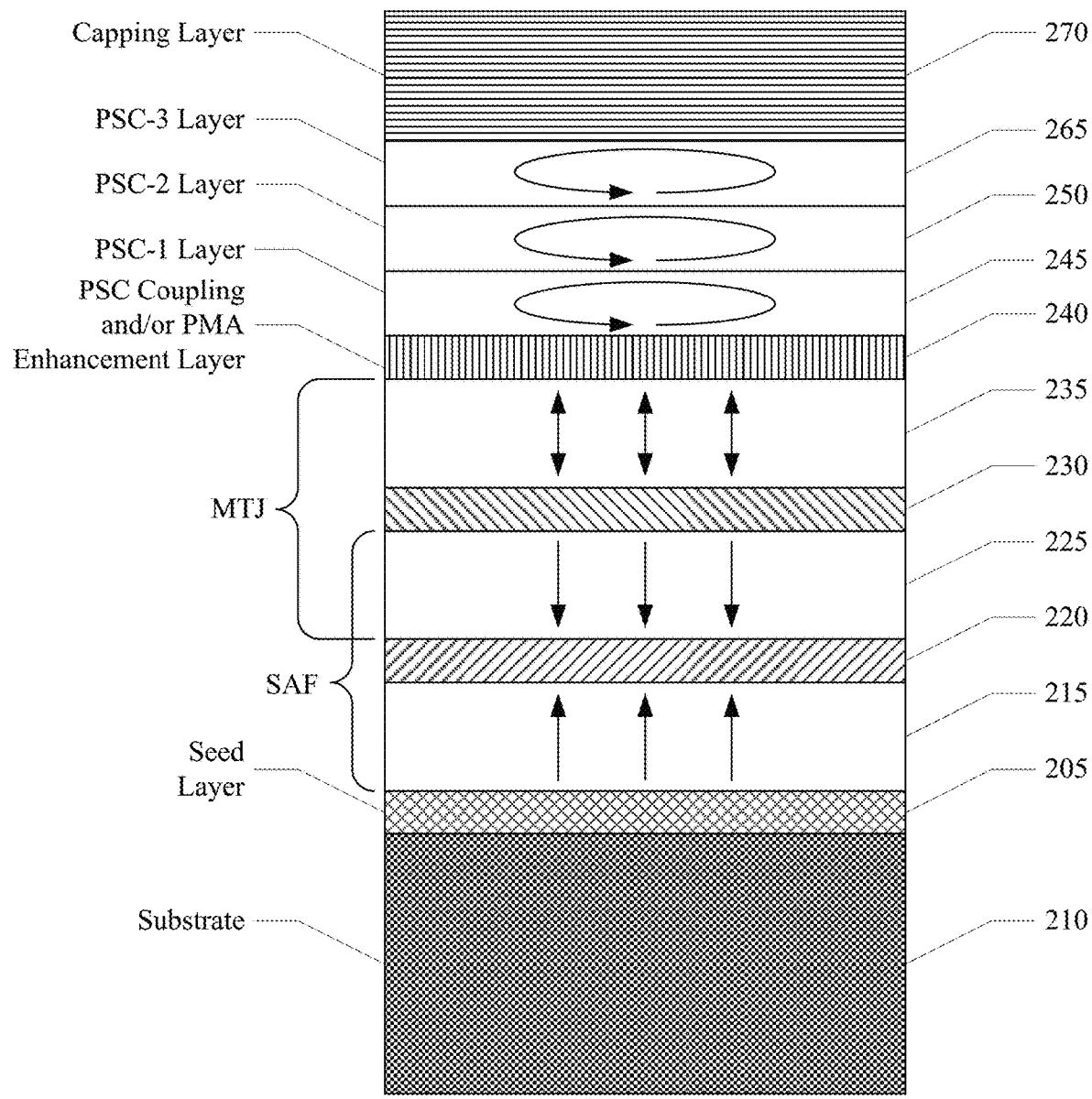

Referring now to FIGS. 3A-3C, a block diagram illustrating fabrication of one or more PSC layers of a Magnetic Tunnel Junction (MTJ), in accordance with embodiments of the present technology, is shown. The processes of forming the seed layer 205 on the substrate 210, the SAF formation 215-225 on the seed layer 205, the MTJ formation 225-235 on the SAF formation 215-225, and the PSC coupling and/or PMA enhancement layer 240 on the MTJ formation 225-235 are well known in the art and are not germane to understanding embodiments of the present technology, and therefore will not be described in further detail herein.

Fabrication of the PSC MTJ after deposition of the PSC coupling and/or PMA enhancement layer 240 can continue with deposition of the first PSC magnetic layer 245. In one aspect, a first PSC magnetic layer 245 of Iron (Fe) can be deposited on the PSC coupling and/or PMA enhancement layer 240. In one implementation, the Iron (Fe) can be deposited using a sputtering, vapor deposition, or similar process. The Iron layer can be deposited to a thickness of approximately 0.6 nm. In one aspect, a second PSC magnetic layer 250 of Ruthenium (Ru) can be deposited on the first PSC magnetic layer 245. In one implementation, the Ruthenium (Ru) can be deposited using a sputtering, vapor deposition, or similar process. The Ruthenium (Ru) can be deposited to a thickness of approximately 2-10 nm. The combination of the PSC coupling and/or PMA enhancement layer 240 and the first and second PSC magnetic layers 245, 250 form and intermediate capping formation. The thickness of the Ruthenium (Ru) can protect the MTJ formation 225-235 from contamination by an ambient environment. In one implementation, the thickness of the Ruthenium (Ru) can protect the MTJ formation 225-235 from oxidation. In one aspect, additional intermediate capping layers 255 can optionally be deposited for additional protection against contamination. In one implementation, an additional intermediate capping layer 255 of Tantalum (Ta) can be deposited on second PSC magnetic layer 250. If the additional intermediate capping layer 255 is used, the thickness of the Ruthenium (Ru) of the second PSC magnetic layer 250 can be reduced to decrease a subsequent etching time. The structure, as fabricate up to this point, can then be exposed to an ambient environment for further processing.

In one aspect, the PSC MTJ can be subject to a two stage-etching process 260 after deposition of the second PSC magnetic layer 250, and after the optional intermediate capping layer 255 if included, as illustrated in FIG. 3A. The two-stage etching process can include a first etch to remove the intermediate capping layer 255 or a portion thereof if included, and optionally a portion of the second PSC magnetic layer 250 at a first rate. A first etch can be performed using Argon (Ar) or Krypton (Kr) plasma etching at the fast rate of approximately 5-20 sec/nanometer and 100-500 Watts power. A second etch can be used to optionally remove another portion of the intermediate capping layer 255 and remove a portion of the PSC magnetic layer 250 at a second slow rate of approximately 60-120 sec/nanometer and 20-100 Watts, as illustrated in FIG. 3B. In one implementation, the second etching process can be performed until the Ruthenium (Ru) of the second PSC coupling layer 250 is thinned to approximate 1-3 nm. The second etching rate can be slower than the first etching rate. In one implementation, the slower second etching rate can smooth the surface of the second PSC magnetic layer 250 as compared to the surface of the PSC magnetic layer 250 as deposited. Smoothing the surface of the second PSC magnetic layer 250 can improve the Precessional Spin Current (PSC) effect by additional control of the coupling mechanism and spin transport enhancement within PSC layers.

In one aspect, a third PSC magnetic layer 265 of Cobalt-Iron-Boron (Co—Fe—B) can be deposited on the second PSC magnetic layer 250 of Ruthenium (Ru) after the two-stage etching process 260. In one implementation, the Cobalt-Iron-Boron (Co—Fe—B) can be deposited using a sputtering, vapor deposition, or similar process. The Cobalt-Iron-Boron (Co—Fe—B) can be deposited to a thickness of approximately 1.85 nm. In one aspect, one or more capping layers 270 can be deposited on the third PSC magnetic layer 265. In one aspect, the two-stage etching process 260, the third PSC magnetic layer 265 deposition, and the one or more capping layer 270 depositions can be performed in-situ without breaking a vacuum of the fabrication equipment used to perform the etching and deposition processes.

In another embodiment, the PSC MTJ fabricated with the Ruthenium (Ru) second PSC magnetic layer 250 and optional intermediate capping layer 255, can be exposed to an ambient environment for transferring to an annealing process. In one aspect, a high temperature annealing process can be configured to enhance performance of the MTJ formation 225-235. In one implementation, a high temperature annealing process can be performed after deposition of the second PSC magnetic layer 250, and the optional intermediate capping layer 255, if used. The second PSC magnetic layer 250, and the optional intermediate capping layer 255 protect the MTJ formation 225-235 from the ambient prior to, during and after annealing. By being able to perform the high temperature annealing after deposition of the second PSC magnetic layer 250, and the optional intermediate capping layer 255, other materials that may be adversely affected by a high-temperature anneal can be utilized in the third PSC magnetic layer 265, and the one or more capping layers 270. In another implementation, the high temperature annealing process can be performed after deposition of the third PSC magnetic layer 265 and the capping layer 270. In one aspect, the two-step etching process 260, the third PSC magnetic layer 265 and the one or more capping layer 270 may not be sensitive to changes due to high temperature annealing. In such case, the high-temperature annealing process utilized for the SAF formation and/or MTJ formation can be performed after the third PSC magnetic layer 265 and the one or more capping layers 270 are deposited. If, however, the materials of the third PSC magnetic layer 265 and/or the one or more capping layer 270 are sensitive to changes due to high temperature annealing, the annealing can be performed after deposition of the second PSC magnetic layer 250 and intermediary capping layer 255.

In one implementation, one or more seed layers 205, the SAF formation 215-225, the MTJ formation 225-235, the optional PSC coupling layer or PMA enhancement layer 240, the first and second PSC magnetic layers 245, 250, and the optional intermediate capping layer 255 can be manufactured by a first entity. Thereafter, the partially fabricated PSC MTJ device can exposed to an ambient environment for transferring to an annealing process. Fabrication can then proceed with in-situ etching to remove the optional intermediate capping layer 255, smoothing the second PSC magnetic layer 245, and forming the third PSC coupling layer 265 and capping layer 270. In another implementation, the partially fabricated PSC MTJ device can exposed to an ambient environment for transferring to a second entity. The second entity can thereafter, proceed with in-situ etching to remove the optional intermediate capping layer 255, smoothing the second PSC magnetic layer 245, and forming the third PSC coupling layer 265 and capping layer 270. Furthermore, an annealing process can be performed by either entity after formation of the second PSC magnetic layer 250 and the optional intermediate capping layer 255.

Figure 4:
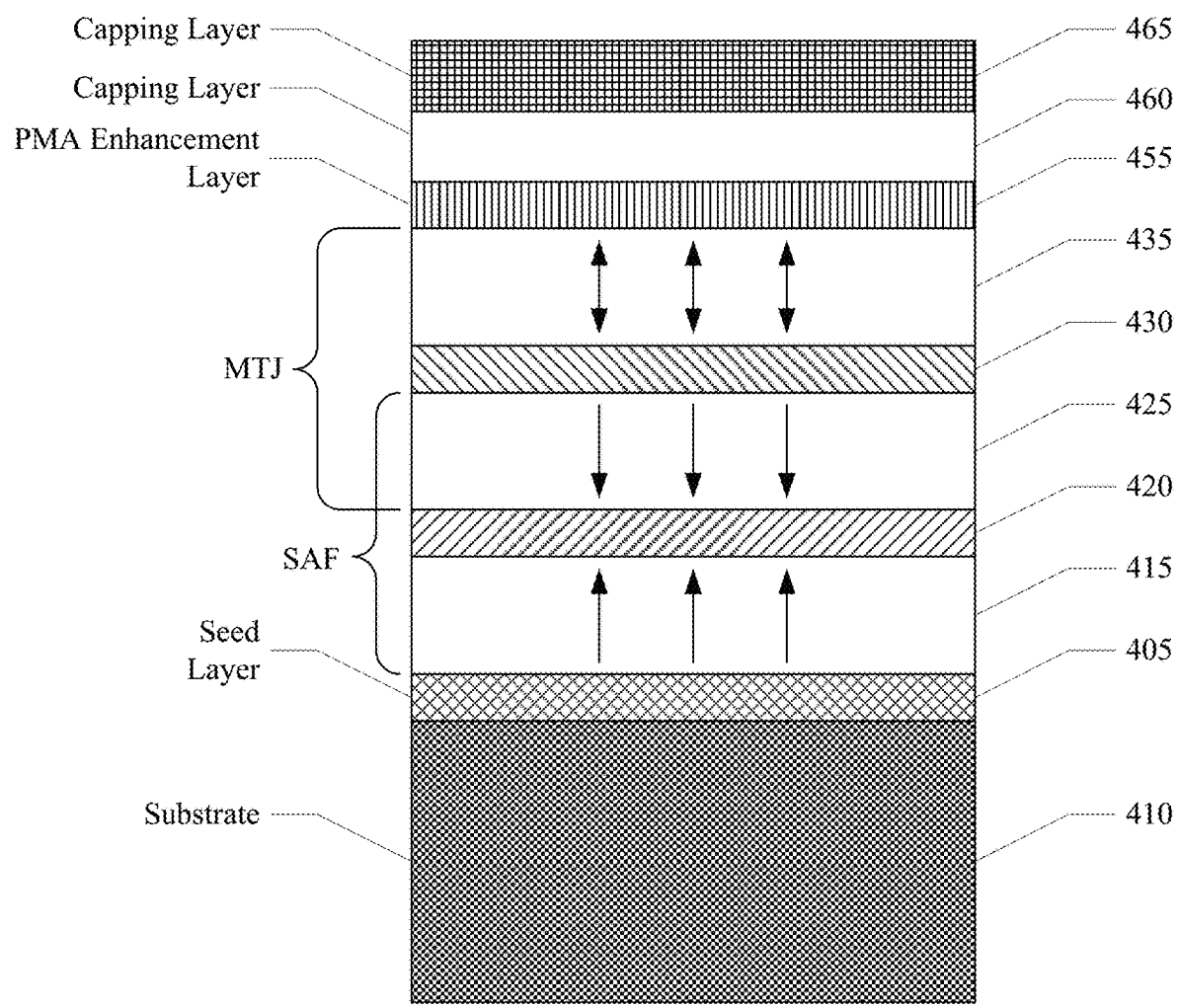
FIG. 4 shows a block diagram of an Interface Perpendicular Magnetic Anisotropies (IMPA) improved MTJ device, in accordance with embodiments of the present technology.

Referring now to FIG. 4, a block diagram of an Interface Perpendicular Magnetic Anisotropies (IPMA) improved MTJ device, in accordance with embodiments of the present technology, is shown. The IMPA improved MTJ 400 can include one or more seed layers 405 disposed on a substrate 410. The one or more seed layers 405 can be deposited on the substrate 410 to initiate a predetermined crystalline growth in one or more subsequent deposited layers. In one implementation, the one or more seed layers 405 can include one or more layers of Tantalum (Ta), Tantalum Nitride (TaN), Chromium (Cr), Copper (Cu), Copper Nitride (CuN), Nickel (Ni), Iron (Fe), or alloys thereof with a thickness of approximately ?? nanometers (nm).

In one aspect, a Synthetic Antiferromagnetic (SAF) formation 415-425 can be disposed on the one or more seed layers 405. In one implementation, the SAF formation 415-425 can include a first ferromagnetic layer 415 disposed on the one or more seed layers 405, a first non-magnetic layer 420 disposed on the first ferromagnetic layer 415, and a second ferromagnetic layer 425 disposed on the first non-magnetic layer 420. The first ferromagnetic layer 415 can be a Cobalt (Co), Cobalt Nickel (CoNi), or Cobalt Platinum (CoPt) alloy with a thickness of approximately 1-5 nm, the first non-magnetic layer 420 can be a Ruthenium (Ru) metal with a thickness of approximately 0.90 nm, the second ferromagnetic layer 425 can be a Cobalt (Co), Cobalt Nickel (CoNi), Cobalt Platinum (CoPt) and/or Cobalt-Iron-Boron (Co—Fe—B) alloy with a thickness of approximately 1-5 nm.

In one aspect, a MTJ formation 425-435 can be disposed on the SAF formation 415-425. In one aspect, the MTJ formation 425-435 can share one or more layers in common with the SAF formation 415-425. In one implementation, the MTJ formation 425-435 can include a reference magnetic layer 425, a non-magnetic tunneling barrier layer 430, and a free magnetic layer 435. The reference magnetic layer 425 and the second ferromagnetic layer 425 can be the same layer of Cobalt-Iron-Boron (Co—Fe—B) alloy with a thickness of approximately 2.3 nm. For ease of explanation, where the second ferromagnetic layer 425 and the reference magnetic layer 425 are the same layer, the combined layer will be referred to as the reference magnetic layer 425. The non-magnetic tunneling barrier layer 430 can be a magnesium (Mg) oxide of approximately 1-100 nm, and the free magnetic layer 435 can be a Cobalt-Iron-Boron (Co—Fe—B) alloy with a thickness of approximately 2.3 nm. The reference magnetic layer 425 can have its magnetization pinned in a predetermined direction, meaning that the reference magnetic layer 425 has a higher coercivity than other layers and a larger magnetic field or spin-polarized current is needed to change the orientation of its magnetization. The magnetization direction of the free magnetic layer 435 can be changed by a smaller magnetic field or sin-polarized current relative to the reference magnetic layer 425.

In one aspect, the magnetization vector of the first ferromagnetic layer 415 and the reference magnetic layer 425 can be substantially perpendicular (e.g., within several degrees) to a plane of the layers (e.g., along a z-axis). The magnetization vector of the free magnetic layer 435 can also be substantially perpendicular to the plane of the layer (e.g., along a z-axis), but its direction can vary by 180 degrees.

In one aspect, an IMPA enhancement layer 455 can be disposed on the MTJ formation 425-435. The PMA enhancement layer 240 can be configured to control perpendicular magnetic anisotropy and free layer magnetization. In one aspect, one or more capping layers 460, 465 can be disposed on the IMPA enhancement layer 455. In one implementation, the one or more capping layer 460, 465 can include non-magnetic materials such as ruthenium (Ru) and tantalum (Ta). In one embodiment, the one or more capping layers 460, 465 can include a first capping layer 460 disposed on the IMPA enhancement layer 455, and a second capping layer 465 disposed on the first capping layer 460. In one implementation the first capping layer 455 can be Ruthenium (Ru) with a thickness of approximately 2-3 nm, and the second capping layer 465 can be Tantalum (a) with a thickness of approximately 3 nm.

Figure 5A:
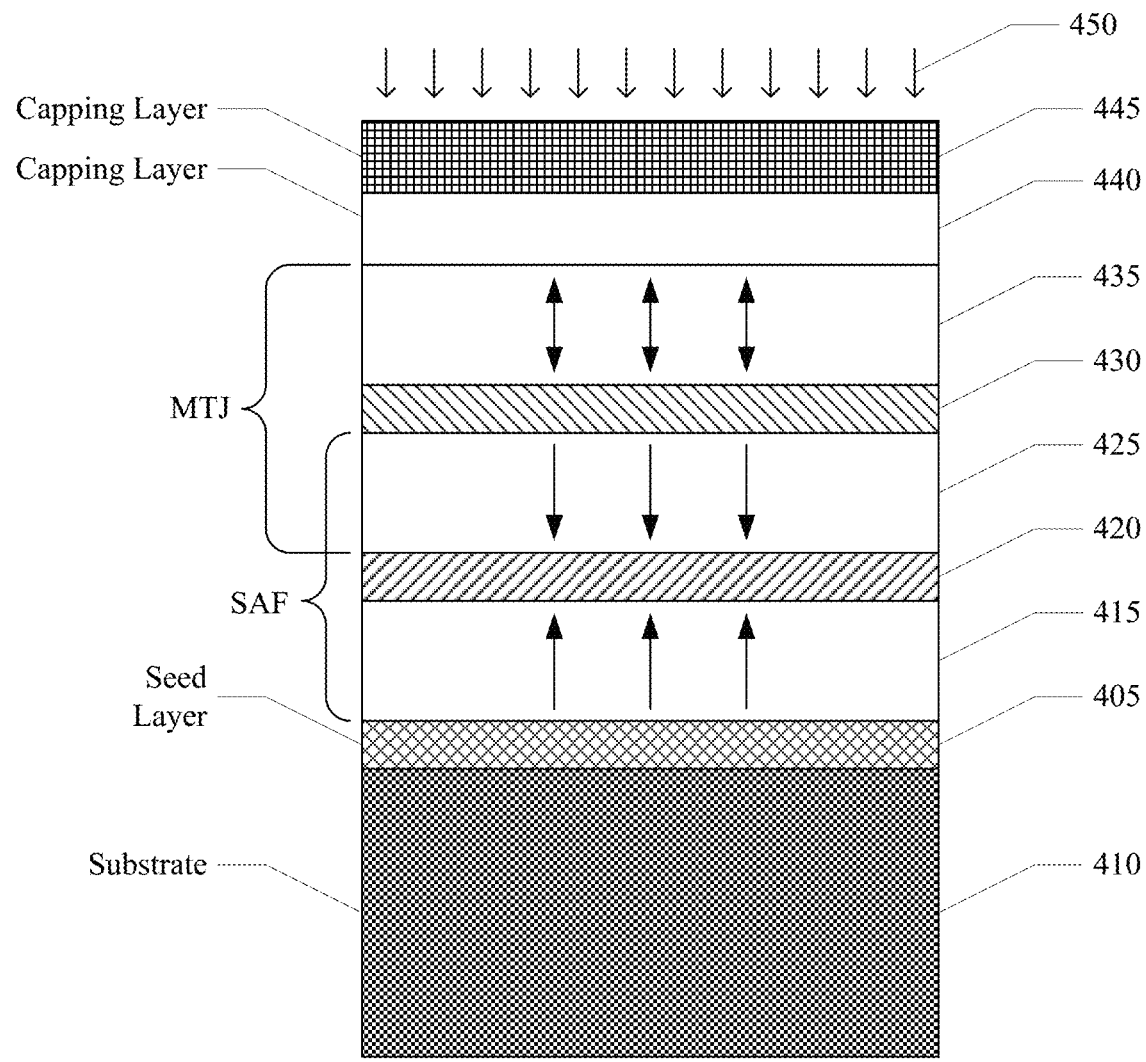
FIGS. 5A-5C show a block diagram illustrating fabrication of an IMPA improved MTJ device, in accordance with embodiments of the present technology.
Figure 5B:
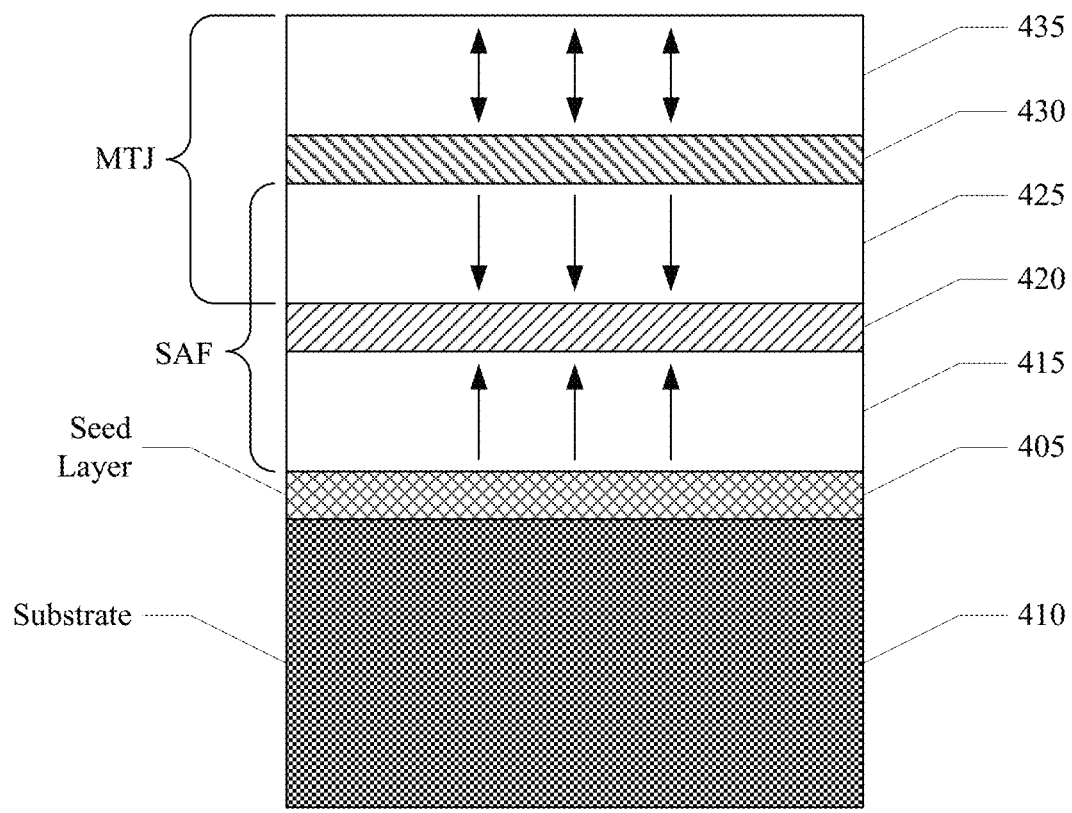
Figure 5C:
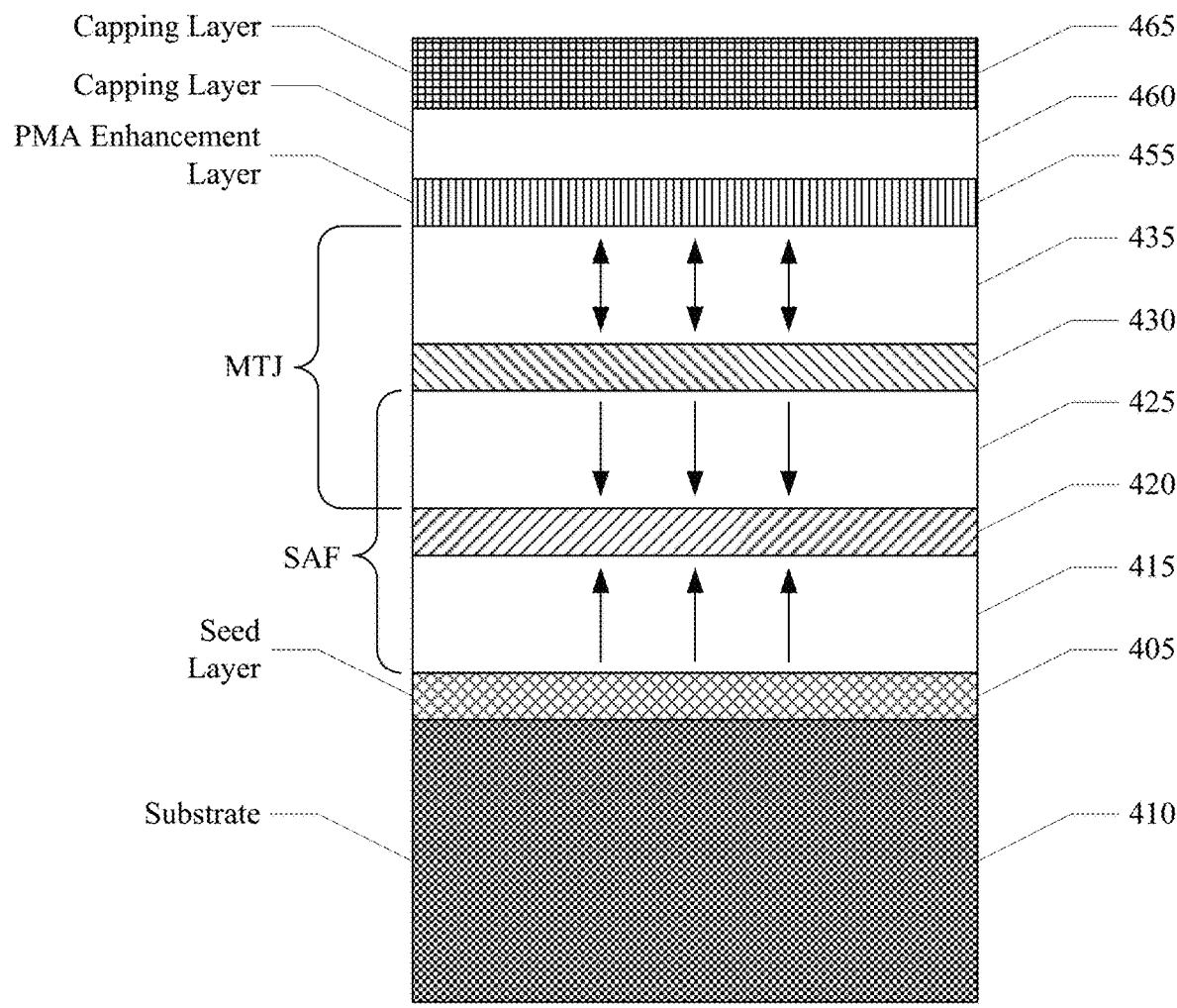

Referring now to FIGS. 5A-5C, a block diagram illustrating fabrication of an IMPA improved MTJ device, in accordance with embodiments of the present technology, is shown. The processes of forming the seed layer 405 on the substrate 410, the SAF formation 415-425 on the seed layer 405, and the MTJ formation 425-435 on the SAF formation 415-425 are well known in the art and are not germane to understanding embodiments of the present technology, and therefore will not be described in further detail herein.

Fabrication of the IMPA improved MTJ after deposition of the MTJ formation 425-435 can continue with deposition of one or more intermediate capping layers 440, 445. In one aspect, a first intermediate capping layer 440 of Ruthenium (Ru) can be deposited on the MTJ formation 425-435, and a second intermediate capping layer 445 of Tantalum (Ta) can be deposited on the first intermediate capping layer 440. In one implementation, the Ruthenium (Ru) can be deposited using a sputtering, vapor deposition, or similar process. The Ruthenium (Ru) can be deposited to a thickness of approximately 2-5 nm. The Tantalum (Ta) can be deposited using a sputtering, vapor deposition, or similar process. The Tantalum (Ta) can be deposited to a thickness of approximately 3 nm.

In one aspect, the IPMA improved MTJ can be subject to a two-stage etching process 450 after deposition of the one or more intermediate capping layers 440, 445. The two-stage etching process 450 can include a first etch used to remove at least a portion of the one or more intermediate capping layers 440, 445. A second etch can be used to optionally remove another portion of the one or more intermediate capping layer 440, 445 and optionally remove a portion of the free magnetic layer 435 at a second rate. In one implementation, the etching process is performed until the Ruthenium (Ru) of the first intermediate capping layer 440 is substantially removed. The second etching rate can be slower than the first etching rate and used to remove any remaining Ruthenium (Ru) of the first intermediate capping layer 440. In one implementation, the slower second etching rate can also smooth the surface of the fee magnetic layer 435 as compared to the surface of the free magnetic layer 435 as deposited. Smoothing the surface of the free magnetic layer 435 can improve Interface Perpendicular Magnetic Anisotropies (IPMA) of the free magnetic layer 435. The two-stage etching process 450 can also allows for deposition of additional enhancement layers on top of the free magnetic layer 435 to control perpendicular anisotropy and free layer magnetization.

In one aspect, a PMA enhancement layer 455 includes one or more of Cobalt (Co), Iron (Fe), Boron (B) and/or Tantalum Nitride (TaN) can be deposited on the free magnetic layer 435 after the two-stage etching process 450. In one implementation, the Tantalum Nitride (TaN) can be deposited using a sputtering, vapor deposition, or similar process. The Tantalum Nitride (TaN) can be deposited to a thickness of approximately 2.0 nm. In one aspect, one or more capping layers 460, 465 can be deposited on the IPMA enhancement layer 455. In one instance, a first capping layer of Ruthenium (Ru) can be deposited on the MTJ formation 425-535, and a second capping layer 465 of Tantalum (Ta) can be deposited on the first capping layer 460. In one implementation, the Ruthenium (Ru) can be deposited using a sputtering, vapor deposition, or similar process. The Ruthenium (Ru) can be deposited to a thickness of approximately 2-5 nm. The Tantalum (Ta) can be deposited using a sputtering, vapor deposition, or similar process. The Tantalum (Ta) can be deposited to a thickness of approximately 3 nm.

In one aspect, the two-stage etching process 450, the IPMA enhancement layer 455 deposition, and the one or more capping layer 460, 465 depositions can be performed in-situ without breaking a vacuum of the fabrication equipment used to perform the etching and deposition processes. In aspect, the IPMA improved MTJ fabricated with the one or more intermediate capping layers 440, 445 can be exposed to an ambient environment for transferring to an annealing process. In one aspect, a high temperature annealing process can be configured to enhance performance of the MTJ formation 425-435. In one implementation, a high temperature annealing process can be performed after deposition of the one or more intermediate capping layers 440, 445. The one or more intermediate capping layers 440, 445 can protect the MTJ formation 425-435 from the ambient prior to, during and after annealing. By being able to perform the high temperature annealing after deposition of the one or more intermediate capping layers 440, 445, other materials that may be adversely affected by a high-temperature anneal can be utilized in the PMA enhancement layer 455, and the one or more capping layers 460, 465. In another implementation, the high temperature annealing process can be performed after deposition of the IPMA enhancement layer 455 and the one or more capping layer 460, 465. In one aspect, the two-step etching process 450, the PMA enhancement layer 455 and the one or more capping layer 460, 465 may not be sensitive to changes due to high temperature annealing. In such case, the high-temperature annealing process utilized for the SAF formation 415-425 and/or MTJ formation 425-435 can be performed after the PMA enhancement layer 455 and the one or more capping layers 460, 465 are deposited. If, however, the materials of the PMA enhancement layer 455 and/or the one or more capping layer 460, 465 are sensitive to changes due to high temperature annealing, the annealing can be performed after deposition of the one or more intermediary capping layers 440, 445.

In one implementation, the one or more seed layers 405, the SAF formation 415-425, the MTJ formation 425-435, and the first and second intermediate capping layers 440, 445 can be manufactured by a first entity. Thereafter, the partially fabricated IMPA improved MTJ device can be exposed to an ambient environment for transferring to an annealing process. Fabrication can then proceed with in-situ etching to remove the first and second intermediate capping layers 440, 445, smoothing the free magnetic layer 435, and forming the optional PMA enhancement layer 455, and forming the first and second capping layers 460, 465. In another implementation, the partially fabricated IMPA improved MTJ device can exposed to an ambient environment for transferring to a second entity. The second entity can thereafter, proceed with in-situ etching to remove the first and second intermediate capping layers 440, 445, smoothing the free magnetic layer 435, and forming the optional PMA enhancement layer 455 and first and second capping layers 460, 465. Furthermore, an annealing process can be performed by either entity after formation of the first and second intermediate capping layers 440, 445.

Figure 6:
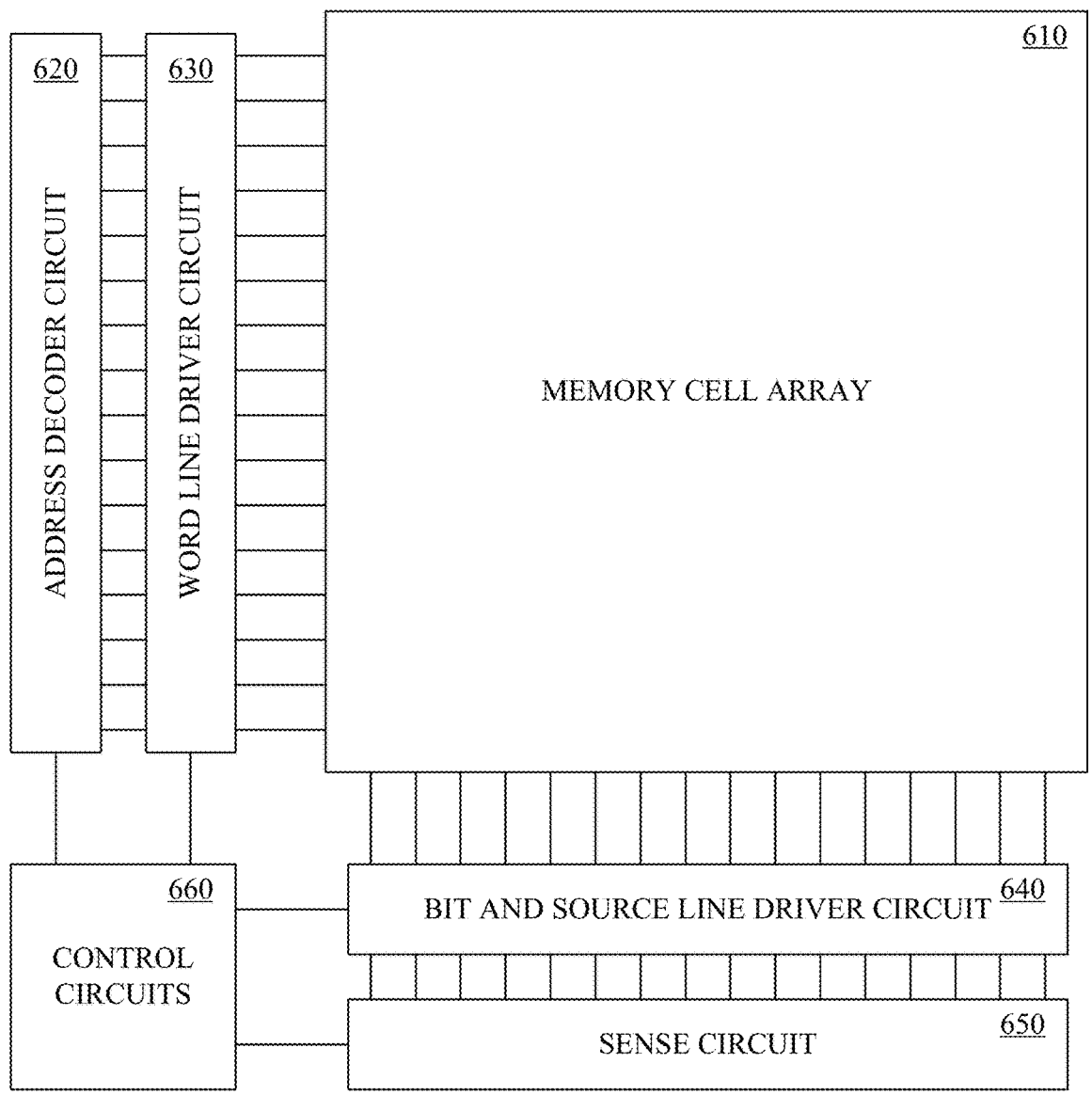
FIG. 6 shows a block diagram of a Magnetoresistive Random Access Memory (MRAM), in accordance with embodiments of the present technology.

Referring now to FIG. 6, a block diagram of a Magnetoresistive Random Access Memory (MRAM), in accordance with embodiments of the present technology, is shown. The MRAM 600 can include a memory cell array 610, an address decoder circuit 620, a word line driver circuit 630, a bit line and source line driver circuit 640, a sense circuit 650, and control circuit 660. The MRAM 600 can include other well-known circuits that are not necessary for an understanding of the present technology and therefore are not discussed herein.

The memory cell array 610 can include a plurality of memory cells organized in rows and columns, with sets of word lines, source lines and bit lines spanning the array of cells throughout the chip. In one embodiment, the memory cells can be PSC MTJ cells as described above with reference to FIGS. 2 and 3A-3C. In another embodiment, the memory cells can be IPMA improved MTJ cells as described above with reference to FIGS. 4 and 5A-5C. The address decoder 620 can map a given memory address to a particular row of MTJ memory cells in the array. The output of the address decoder 620 can be input to the word line driver 630. The output of the word line driver 630 can drive the word lines to select a given word line of the array. The bit line and source line driver 640 and the sense circuit 650 utilize the source lines and bit lines of the array to read from and write to memory cells of a selected word line of the array.

In one aspect, the control circuit 660 can be configured to cause the bit line and source line driver circuit 640 to apply appropriate write voltages to bit lines, source lines and word lines to write data to cells in a selected word. The magnetic polarity, and corresponding logic state, of the free layer of the MTJ can be changed to one of two states depending upon the direction of current flowing through the MTJ. For read operations, the control circuit 660 can be configured to cause the bit line and source line driver circuit 640 to apply appropriate read voltages to the bit lines, sources lines and word lines to cause a current to flow in the source lines that can be sensed by the sense circuit 650 to read data from cells in a selected word.

Figure 7:
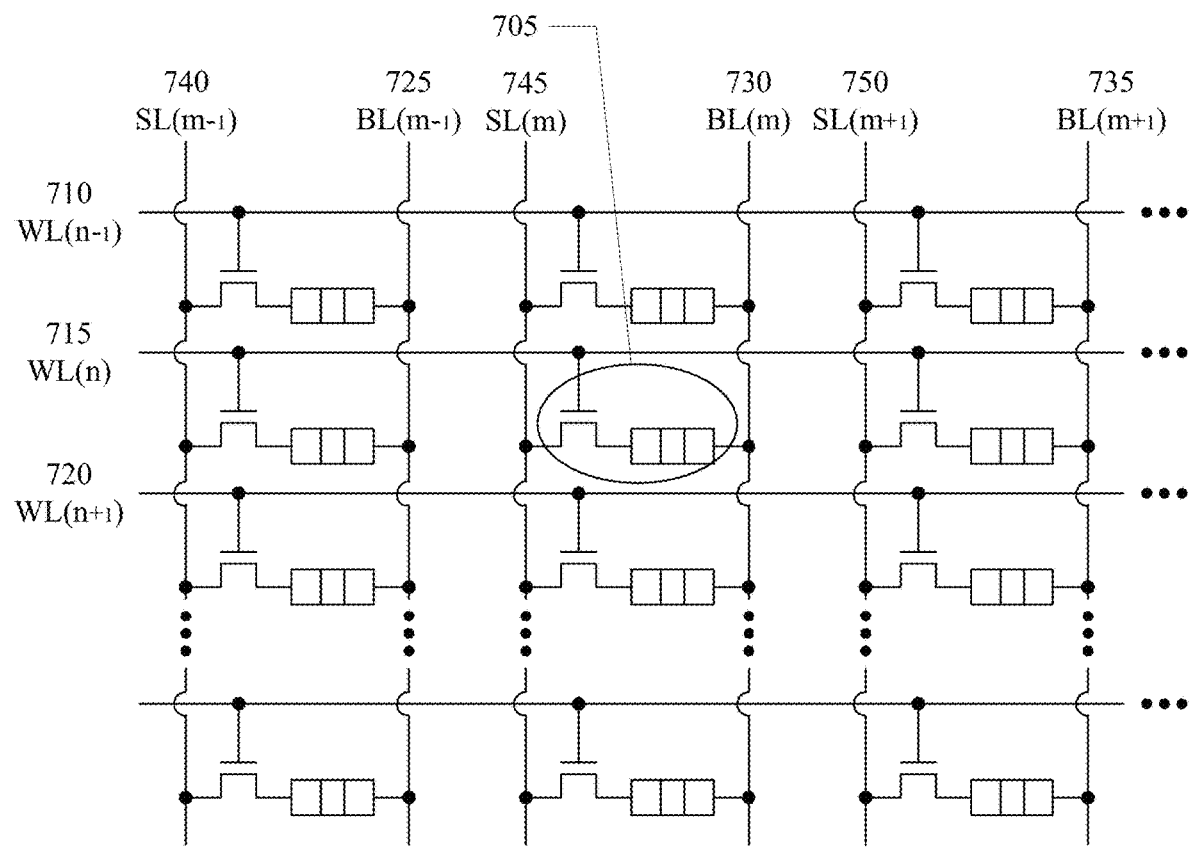
FIG. 7 shows a circuit diagram of a MRAM memory cell array, in accordance with the conventional art.

Referring now to FIG. 7, a circuit diagram of a MRAM memory cell array, in accordance with the conventional art, is shown. Again, the memory cell array 700 can include a plurality of MTJ memory cells 705, a plurality of word lines 710-720, a plurality of bit lines 725-735 and a plurality of source lines 740-750. The word lines 710-720 of the memory cell array 700 can be organized along columns of the array. The bit lines 725-735 and source lines 740-750 can be organized along rows of the array. Each memory cell 705 can comprise a MTJ cell and an access transistor. The gates of the access transistors arranged along columns of the array can be coupled to respective word lines 710-720. The sources of the access transistors arranged along rows of the array can be coupled to respective source lines 740-750. The free magnetic layer of the MTJ cells arranged along rows of the array can be coupled to a respective bit line 725-735.

In one example, to read data from a given MTJ cell 705, the respective bit line BL(m) 730 can be biased at a bit line read potential (e.g., $V_{BLR}$) and the respective source line SL(m) 745 can be biased at ground (e.g., 0). When the respective word line WL(n) 715 is biased at a word line read voltage potential (e.g., $V_{WLR}$) a current proportional to the resistance of the MTJ of the cell 705 will flow from the respective bit line BL(m) 730 to the respective source line SL(m) 745. In such case, the current sensed on the respective bit line BL(m) 730 can indicate the state of the selected cell 705.

To write a logic '0' state to the given memory cell 705, the respective bit line BL(m) 730 can be biased at a bit line write potential (e.g., $V_{BLW}$) and the respective source line SL(m) 745 can be biased at ground (e.g., 0). When the respective word line WL(n) 715 is biased at a word line write potential (e.g., $V_{WLW}$) a resulting current flowing through the MTJ of the cell 705 in a first direction will cause the free magnetic layer into a state corresponding to a logic '0' state. To write a logic '1' state to the given memory cell 705, the respective bit line BL(m) 730 can be biased at ground (e.g., 0) and the respective source line SL(m) 745 can be biased at a source line write potential (e.g., $V_{SLW}$). When the respective word line WL(n) 715 is biased at a word line write potential (e.g., $V_{WLW}$) a resulting current flowing through the MTJ of the cell 705 in a second direction will cause the free magnetic layer into a state corresponding to a logic '1' state.

In another example, to read data from a given memory cell 705, the respective bit line BL(m) 730 can be biased at ground (e.g., 0) and the respective source line SL(m) 745 can be biased at a bit line read potential (e.g., $V_{BLR}$). When the respective word line WL(n) 715 is biased at a word line read potential (e.g., $V_{WRL}$) a current proportional to the resistance of the MTJ of the given cell 705 will flow. In such case, the current sensed on the respective source line SL(m) 745 can indicate the state of the selected cell 705.

To write a logic '0' state to the given memory cell 705, the respective bit line BL(m) 730 can be biased at a bit line write potential (e.g., $V_{BLW}$) and the respective source line SL(m) 745 can be biased at ground (e.g., 0). When the respective word line WL(n) 715 is biased at a word line write potential (e.g., $V_{WLW}$) a resulting current flowing through the MTJ of the cell 705 in a first direction will cause the free magnetic layer into a logic '0' state. To write a logic '1' state to a given memory cell 705, the respective bit line BL(m) 730 can be biased at ground (e.g., 0) and the respective source line SL(m) 745 can be biased at a source line write potential (e.g., $V_{SLW}$). When the respective word line WL(n) 715 is biased at a word line write state (e.g., $V_{WLW}$) a resulting current flowing through the MTJ of the cell 705 in a second direction will cause the free magnetic layer into a logic '1' state.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method of fabricating a Magnetic Tunnel Junction (MTJ) device comprising:
   depositing a first Precessional Spin Current (PSC) magnetic layer on a MTJ formation, wherein the first PSC magnetic layer includes Iron (Fe);
   depositing a second PSC magnetic layer on the first PSC magnetic layer, wherein the second PSC magnetic layer includes Ruthenium (Ru);
   etching at least a portion of the second PSC magnetic layer with a first etch process to smooth the surface of the Ruthenium (Ru) of the second PSC magnetic layer as deposited;
   depositing a third PSC magnetic layer on the second PSC magnetic layer after the first etch of the second PSC magnetic layer, wherein the third PSC magnetic layer includes one or more of Cobalt (Co), Iron (Fe) and Boron (B); and
   depositing a capping layer on the third magnetic layer.

2. The method of fabricating the MTJ device according to claim 1, wherein:
   the first PSC magnetic layer has a deposited thickness of approximately 0.4-1.0 nanometers (nm);
   the second PSC magnetic layer has a deposited thickness of approximately 0.5-3.0 nm after the first etch of the second PSC magnetic layer; and
   the third PSC magnetic layer has a deposited thickness of approximately 1-5 nm.

3. The method of fabricating the MTJ device according to claim 1, wherein:
   the first and second PSC magnetic layers are deposited in a first vacuum instance; and
   the second PSC magnetic layer is etched and the third PSC magnetic layer and the capping layer are deposited in a second vacuum instance.

4. The method of fabricating the MTJ device according to claim 3, further comprising:
   annealing the MTJ formation after depositing the first and second PSC magnetic layers and before etching the second PSC magnetic layer.

5. The method of fabricating the MTJ device according to claim 4, further comprising:
   depositing an intermediate capping layer on the second PSC magnetic layer in the first vacuum instance; and
   etching the intermediate capping layer with a second etch in the second vacuum instance, wherein the second etch and the first etch comprise a two-step etching process where the second etch is faster than the first etch.

6. The method of fabricating the MTJ device according to claim 3, further comprising:
   depositing a PSC coupling layer in the first vacuum instance, wherein the PSC coupling layer is disposed between the first PSC magnetic layer and the MTJ formation.

7. The method of fabricating the MTJ device according to claim 3, further comprising:
   depositing a Perpendicular Magnetic Anisotropy (PMA) enhancement layer in the first vacuum instance, wherein the PMA enhancement layer is disposed between the first PSC magnetic layer and the MTJ formation.

8. The method of fabricating the MTJ device according to claim 6, further comprising:
   depositing a reference magnetic layer of the MTJ formation in the first vacuum instance, wherein the reference magnetic layer is disposed on a substrate;
   depositing a non-magnetic tunneling barrier layer of the MTJ formation in the first vacuum instance, wherein the non-magnetic tunneling barrier layer is disposed on the reference magnetic layer; and
   depositing a free magnetic layer of the MTJ formation in the first vacuum instance, wherein the free magnetic layer is disposed on the non-magnetic tunneling barrier layer.

9. The method of fabricating the MTJ device according to claim 8, wherein:
   the reference magnetic layer includes one or more of Cobalt (Co), Iron (Fe), Boron (B), Cobalt Nickel (CoNi), Cobalt Platinum (CoPt), and has a deposited thickness of approximately 1-5 nanometers (nm);
   the non-magnetic tunneling barrier layer includes Magnesium (Mg) oxide, and has a deposited thickness of approximately 1-10 nm; and
   the free magnetic layer includes one or more of Cobalt (Co), Iron (Fe) and Boron (B), and has a deposited thickness of approximately 1-3 nm.

10. The method of fabricating the MTJ device according to claim 8, further comprising:
    depositing a first ferromagnetic layer of a Synthetic Antiferromagnetic (SAF) formation in the first vacuum instance, wherein the first ferromagnetic layer is disposed on the substrate; and
    depositing a first non-magnetic layer of the SAF formation in the first vacuum instance, wherein the first non-magnetic layer is disposed between the first ferromagnetic layer and the reference magnetic layer.

11. The method of fabricating the MTJ device according to claim 10, wherein
    the first ferromagnetic layer includes one or more of Cobalt (Co), Cobalt Nickel (CoNi) and Cobalt Platinum (CoPt), and has a deposited thickness of approximately 1-5 nm; and
    the first non-magnetic layer includes Ruthenium (Ru), and has a deposited thickness of approximately 0.9 nm.

12. The method of fabricating the MTJ device according to claim 11, further comprising:
    depositing a seed layer in the first vacuum instance, wherein the seed layer is disposed between the substrate and the first ferromagnetic layer.

13. The method of fabricating the MTJ device according to claim 1, wherein the MTJ device comprises a Magnetoresistive Random Access Memory (MRAM).

14. A method of fabricating a Magnetic Tunnel Junction (MTJ) device comprising:
    receiving a wafer including a first Precessional Spin Current (PSC) magnetic layer disposed on a MTJ formation and a second PSC magnetic layer disposed on the first PSC magnetic, wherein the first PSC magnetic layer includes Iron (Fe) and the second PSC magnetic layer includes Ruthenium (Ru);
    etching at least a first portion of the second PSC magnetic layer with a first etch process to remove the first portion of the second PSC magnetic layer;
    etching at least a second portion of the second PSC magnetic layer with a second etch process to smooth the surface of the Ruthenium (Ru) of the second PSC magnetic layer as deposited, wherein the second etch process is slower than the first etch process;
    depositing a third PSC magnetic layer on the second PSC magnetic layer after the second etch of the second PSC magnetic layer, wherein the third PSC magnetic layer includes one or more of Cobalt (Co), Iron (Fe) and Boron (B); and depositing a capping layer on the third magnetic layer.

15. The method of fabricating the MTJ device according to claim 14, further comprising:

annealing the wafer before etching at least the first portion of the second PSC magnetic layer.

16. The method of fabricating the MTJ device according to claim 14, wherein:

the first PSC magnetic layer has a deposited thickness of approximately 0.4-1.0 nanometers (nm);

the second PSC magnetic layer has a deposited thickness of approximately 0.5-3.0 nm after the second etch of the second PSC magnetic layer; and the third PSC magnetic layer has a deposited thickness of approximately 1-5 nm.

* * * * *